(12) United States Patent
Prikhodko et al.

(10) Patent No.: US 8,452,243 B2
(45) Date of Patent: May 28, 2013

(54) SYSTEM AND METHOD FOR POWER DETECTION IN A POWER AMPLIFIER USING AN ADJUSTABLE LOAD

(75) Inventors: Dima Prikhodko, Reading, MA (US); Hichem Abdallah, Cambridge, MA (US); Sergey Nabokin, Pelham, NH (US); Gene A. Tkachenko, Belmont, MA (US)

(73) Assignee: Skyworks Solutions, Inc., Woburn, MA (US)

( * ) Notice: Subject to any disclaimer, the term of this patent is extended or adjusted under 35 U.S.C. 154(b) by 605 days.

(21) Appl. No.: 12/541,338

(22) Filed: Aug. 14, 2009

(65) Prior Publication Data
US 2009/0318093 A1  Dec. 24, 2009

Related U.S. Application Data

(63) Continuation-in-part of application No. 12/116,980, filed on May 8, 2008.

(60) Provisional application No. 61/088,973, filed on Aug. 14, 2008.

(51) Int. Cl.
*H03C 1/52* (2006.01)
*H01Q 11/12* (2006.01)
*H04B 1/04* (2006.01)

(52) U.S. Cl.
USPC .................... 455/107; 455/126; 455/127.2

(58) Field of Classification Search
USPC ................. 455/107, 126, 127.1, 127.2
See application file for complete search history.

(56) References Cited

U.S. PATENT DOCUMENTS

| | | | |
|---|---|---|---|
| 6,020,787 A * | 2/2000 | Kim et al. | 330/279 |
| 6,265,943 B1 | 7/2001 | Dening et al. | |
| 6,617,920 B2 * | 9/2003 | Staudinger et al. | 330/149 |
| 6,734,729 B1 | 5/2004 | Andrys et al. | |
| 6,847,261 B2 | 1/2005 | Iwata et al. | |
| 7,010,282 B2 | 3/2006 | Kazakevich et al. | |
| 7,433,658 B1 | 10/2008 | Shirvani-Mahdavi et al. | |
| 2001/0020872 A1 | 9/2001 | Miyazawa | |
| 2004/0083409 A1 | 4/2004 | Rozenblit et al. | |
| 2004/0198465 A1 | 10/2004 | Nation | |
| 2005/0245213 A1 | 11/2005 | Hirano et al. | |
| 2006/0186964 A1 | 8/2006 | Prikhodko et al. | |
| 2006/0223462 A1 * | 10/2006 | Rahman et al. | 455/126 |
| 2006/0267688 A1 | 11/2006 | Tanoue et al. | |
| 2007/0008038 A1 | 1/2007 | Klepser et al. | |
| 2008/0003962 A1 * | 1/2008 | Ngai | 455/179.1 |
| 2009/0289719 A1 | 11/2009 | Van Bezooijen et al. | |

OTHER PUBLICATIONS

Supplementary European Search Report for Application No. EP 08 75 5143, completed on Apr. 25, 2012 in 5 pages.
International Search Report for International Application No. PCT/US2008/062988, mailed on Sep. 30, 2008 in 2 pages.
International Preliminary Report on Patentability issued on Nov. 10, 2009 and Written Opinion mailed on Sep. 30, 2008 for International Application No. PCT/US2008/062988.

* cited by examiner

*Primary Examiner* — Nguyen Vo
(74) *Attorney, Agent, or Firm* — Knobbe Martens Olson & Bear LLP (57) ABSTRACT

A power amplifier system includes a first power detector configured to detect a forward power output of a power amplifier, the first power detector configured to provide a first power detector output and an adjustable load coupled to the output of the power amplifier and configured to receive the first power detector output, the adjustable load configured to provide an adjustable impedance at the output of the power amplifier in response to one of the output of the power amplifier and the first power detector output.

15 Claims, 11 Drawing Sheets

FIG. 13

SYSTEM AND METHOD FOR POWER DETECTION IN A POWER AMPLIFIER USING AN ADJUSTABLE LOAD

CROSS-REFERENCE TO RELATED APPLICATION

This application claims priority to and the benefit of the filing date of U.S. Provisional Patent Application No. 61/088,973, filed on Aug. 14, 2008, entitled "Dynamically Adjustable Load For The Linearity Improvement," the entire disclosure of which is hereby incorporated herein by reference; and is a continuation-in-part of U.S. patent application Ser. No. 12/116,980, filed on May 8, 2008, entitled "System And Method For Power Detection In A Power Amplifier," the entire disclosure of which is hereby incorporated herein by reference.

BACKGROUND

Portable communication devices, such as cellular telephones, personal digital assistants (PDAs), WIFI transceivers, and other communication devices must be capable of communicating more and more data. For example, in the emerging markets of 3G/3.9G, linear systems such as those the communicate using standards such as WCDMA, WiMAX, EUTRAN-LTE, and other non-constant envelope modulation methodologies, the requirement for highly efficient power amplifiers that exhibit good linearity and power control under mismatch continues to be very challenging.

The power detection architecture and methodology is one of the key parameters in maintaining power amplifier linearity and linear power control. A number of well-known detection architectures and methodologies are currently used, including forward power detection using a coupler and a detector; implementing a detector at the power amplifier output, for example using a collector voltage detector; and current detection using a current mirror.

The forward power detection using a power coupler and power detector methodology is appropriate for a nonlinear system such as GSM because it allows constant output power to be maintained for different phases having different mismatch. However, such a forward power detection scheme is not as effective for a high peak-to-average ratio (PAR) linear system because for high impedance phases of the output signal the collector voltage has to be significantly increased in order to maintain the same linear output power. Unfortunately, this arrangement leads to premature power amplifier compression.

Implementing a detector at the power amplifier output, for example using a collector voltage detector, is more preferable than implementing power amplifier output voltage detection because of the phase shift imposed by the matching circuitry, which is typically located between the collector of the power amplifier and the output terminal of the power amplifier. Maintaining the collector voltage constant in a closed power control loop keeps the amount of back-off constant regardless of the different phases having differing mismatch. However, this is achieved at the expense of output power. Even though the requirements for output power deviation are not as stringent in a linear system, excessive power drop under mismatch is not acceptable.

The current detection scheme using a current mirror is not applicable to a linear system because for most nonlinear high impedance phases the current drops, which causes the input power to increase in the closed power control loop. This leads to further power amplifier compression.

One approach that provides a good compromise between power and linearity is the use of a balanced power amplifier. However, a balanced power amplifier adds complexity and physical size. Further, a balanced power amplifier may introduce additional losses in a 90 degree hybrid circuit, which leads to degraded efficiency.

Therefore, a detector which is capable of detecting output power and maintaining power amplifier linearity is desirable.

SUMMARY

Embodiments of a power amplifier system comprise a first power detector configured to detect a forward power output of a power amplifier, the first power detector configured to provide a first power detector output and an adjustable load coupled to the output of the power amplifier and configured to receive the first power detector output, the adjustable load configured to provide an adjustable impedance at the output of the power amplifier in response to one of the output of the power amplifier and the first power detector output.

Other embodiments are also provided. Other systems, methods, features, and advantages of the invention will be or become apparent to one with skill in the art upon examination of the following figures and detailed description. It is intended that all such additional systems, methods, features, and advantages be included within this description, be within the scope of the invention, and be protected by the accompanying claims.

BRIEF DESCRIPTION OF THE FIGURES

The invention can be better understood with reference to the following figures. The components within the figures are not necessarily to scale, emphasis instead being placed upon clearly illustrating the principles of the invention. Moreover, in the figures, like reference numerals designate corresponding parts throughout the different views.

DETAILED DESCRIPTION

Although described with particular reference to a portable transceiver, the system and method for power detection in a power amplifier using an adjustable load can be implemented in any transmitter in which it is desirable to detect output power while maximizing the linearity of the power amplifier.

In an embodiment, the system and method for power detection in a power amplifier using an adjustable load uses a forward power detector and an adjustable load at the collector of the power amplifier output stage. The adjustable load is responsive to an output of the forward power detector and can be configured using passive components as a discrete element, or can be integrated within other circuitry, such as within output impedance matching circuitry. The adjustable load significantly improves the linearity of the power amplifier output with respect to the power amplifier control signal.

In an alternative embodiment, the system and method for power detection in a power amplifier using an adjustable load uses a forward power detector and a secondary detector. The secondary detector is configured to detect a collector parameter of the power amplifier output stage. The output of the forward power detector and the secondary power detector are combined to control a power output of the power amplifier. The secondary detector has an architecture that allows the load presented at the collector of the power amplifier to be responsive to the output of the forward power detector. The adjustable load significantly improves the linearity of the power amplifier output with respect to the power amplifier control signal.

In an embodiment, the collector parameter can be collector voltage. However, other collector parameters, such as collector current, can be detected. The primary cause of linearity degradation in a power amplifier is saturation of the power amplifier caused by high collector voltage. Therefore, in an embodiment, collector voltage can be used as a reliable indicator of the saturation effect of the power amplifier.

The system and method for power detection in a power amplifier using an adjustable load can be implemented in hardware, software, or a combination of hardware and software. When implemented in hardware, the system and method for power detection in a power amplifier using an adjustable load can be implemented using specialized hardware elements and logic. When the system and method for power detection in a power amplifier using an adjustable load is implemented partially in software, the software portion can be used to precisely control the various components in a power amplifier control element. The software can be stored in a memory and executed by a suitable instruction execution system (microprocessor). The hardware implementation of the system and method for power detection in a power amplifier using an adjustable load can include any or a combination of the following technologies, which are all well known in the art: discrete electronic components, a discrete logic circuit(s) having logic gates for implementing logic functions upon data signals, an application specific integrated circuit having appropriate logic gates, a programmable gate array(s) (PGA), a field programmable gate array (FPGA), etc.

The software for the system and method for power detection in a power amplifier using an adjustable load comprises an ordered listing of executable instructions for implementing logical functions, and can be embodied in any computer-readable medium for use by or in connection with an instruction execution system, apparatus, or device, such as a computer-based system, processor-containing system, or other system that can fetch the instructions from the instruction execution system, apparatus, or device and execute the instructions.

In the context of this document, a "computer-readable medium" can be any means that can contain, store, communicate, propagate, or transport the program for use by or in connection with the instruction execution system, apparatus, or device. The computer readable medium can be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection (electronic) having one or more wires, a portable computer diskette (magnetic), a random access memory (RAM), a read-only memory (ROM), an erasable programmable read-only memory (EPROM or Flash memory) (magnetic), an optical fiber (optical), and a portable compact disc read-only memory (CDROM) (optical). Note that the computer-readable medium could even be paper or another suitable medium upon which the program is printed, as the program can be electronically captured, via for instance, optical scanning of the paper or other medium, then compiled, interpreted or otherwise processed in a suitable manner if necessary, and then stored in a computer memory.

Figure 1:
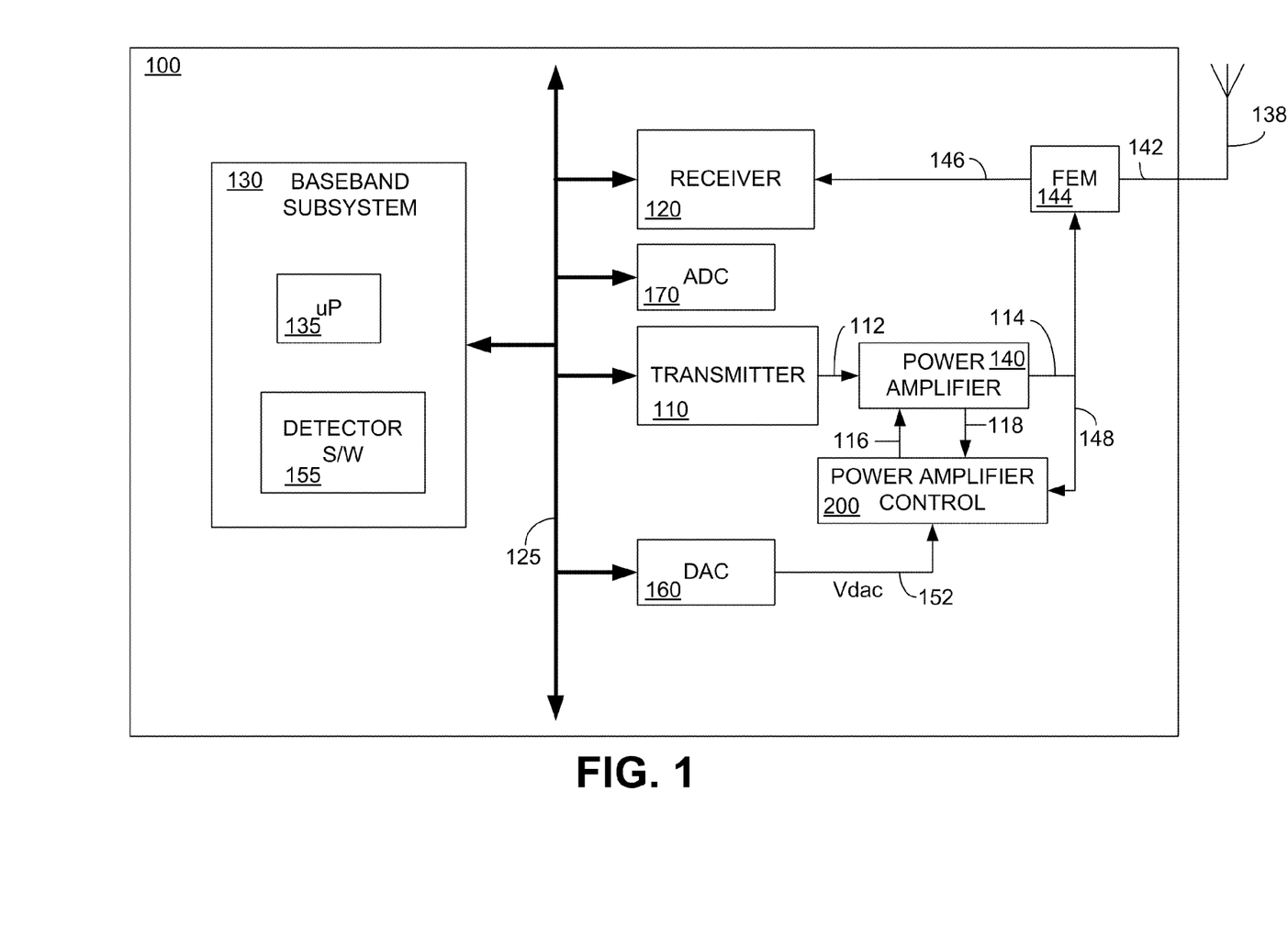
FIG. 1 is a block diagram illustrating a simplified portable transceiver.

FIG. 1 is a block diagram illustrating a simplified portable transceiver 100. Embodiments of the system and method for power detection in a power amplifier using an adjustable load can be implemented in any power amplifier system. The portable transceiver 100 illustrated in FIG. 1 is intended to be a simplified example and to illustrate one of many possible applications in which the system and method for power detection in a power amplifier using an adjustable output load can be implemented. One having ordinary skill in the art will understand the operation of a portable transceiver. The portable transceiver 100 includes a transmitter 110, a receiver 120, a baseband subsystem 130, a digital-to-analog converter (DAC) 160 and an analog-to-digital converter (ADC) 170 connected over a communication bus 125. The transmitter 110 may include a modulator, an upconverter, and any other functional elements that modulate and upconvert a baseband signal. The receiver 120 includes filter circuitry, downconverter circuitry and demodulation circuitry that enable the recovery of the information signal from the received RF signal. The portable transceiver 100 also includes a power amplifier 140 and a power amplifier control element 200. The output of the transmitter 110 is provided over connection 112 to the power amplifier 140.

The receiver 120 and the power amplifier 140 are connected to a front end module 144. The front end module 144 can be a duplexer, a diplexer, or any element that separates the transmit signal from the receive signal. The front end module 144 is connected to an antenna 138 over connection 142.

In transmit mode, the output of the power amplifier 140 is provided to the front end module 144 over connection antenna 114. In receive mode, the front end module 144 provides a receive signal to the receiver 120 over connection 146.

A portion of the output of the power amplifier 140 is provided to the power amplifier control element 200 over connection 148. The power amplifier control element 200 also receives a power control signal ($V_{dac}$) from the DAC 160 over connection 152 and, in an embodiment using a secondary power detector, also receives a collector parameter signal over connection 118. The power amplifier control element 200 provides a power amplifier control signal ($V_L$) to the power amplifier 140 over connection 116. As will be described below, the feedback signal on connection 148 is a signal that is representative of the forward power output of the power amplifier 140. The collector parameter signal on connection 118 is a signal that is representative of a parameter of the collector of the power amplifier output stage. In an embodiment, the collector parameter signal on connection 118 is a voltage signal that represents the collector voltage ($V_{ce}$) on the power amplifier output stage, and is an indicator of power amplifier saturation. However, other collector parameter signals may be monitored.

If portions of the system and method for power detection in a power amplifier using an adjustable load are implemented in software, then the baseband subsystem 130 also includes detector software 155 that can be executed by a microprocessor 135, or by another processor, to control the operation of the system and method for power detection in a power amplifier using an adjustable output load to be described below.

Figure 2:
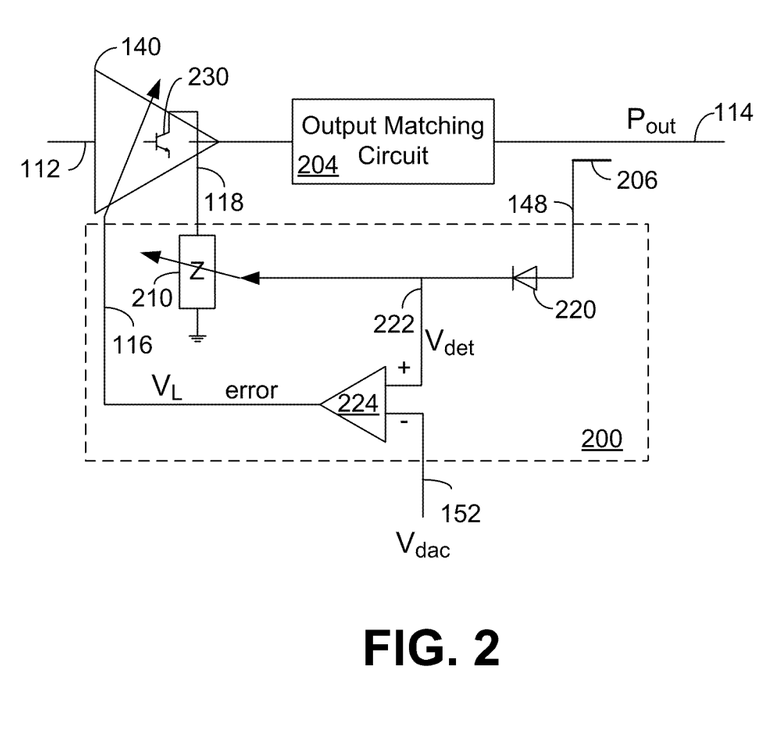
FIG. 2 is a simplified schematic diagram illustrating an embodiment of a power control system implemented using an embodiment of the system and method for power detection in a power amplifier using an adjustable load.

FIG. 2 is a simplified schematic diagram illustrating an embodiment of a power control system 200 implemented using an embodiment of the system and method for power detection in a power amplifier using an adjustable load. The power amplifier control element 200 receives a portion of the output of the power amplifier 140, as modified by an output matching circuit 204, on connection 114 via a radio frequency (RF) coupler 206. The RF feedback signal is provided over connection 148 to a first detector 220. For illustrative purposes only, the first detector 220 is illustrated as a diode. In an embodiment, the first detector 220 may comprise a diode detector, or any other type of average or peak power detector. The first detector 220 is also referred to as a forward power detector because it receives the forward power output signal from the power amplifier 140.

Although illustrated schematically as a single power amplifier, the power amplifier 140 may include a number of power amplifier output stages, an exemplary one of which is illustrated schematically as a bi-polar junction transistor using reference numeral 230. However, other transistor structures, such as a field effect transistor, may be implemented. The power amplifier output stage 230 is shown as a bipolar transistor to illustrate that a collector parameter is provided to an adjustable load 210. The collector parameter can be, for example, a collector voltage signal, a collector current signal, or any other collector parameter.

In an embodiment, the adjustable load 210 can comprise circuitry to generate an adjustable load by varying, adjusting, modifying or otherwise influencing the impedance at the collector terminal of the power amplifier output stage 230 on connection 118. In an embodiment, the impedance provided by the adjustable load 210 is responsive to a signal provided by the first detector 220 on connection 222. Although shown as a separate element, in alternative embodiments, the adjustable load 210 may be implemented within the output matching circuit 204.

The output of the first detector 220 is a detector signal ($V_{det}$) that is supplied over connection 222 to the adjustable load 210 and to the non-inverting input of a comparator 224. A reference signal ($V_{dac}$) from the DAC 160 (FIG. 1) is supplied via connection 152 to the inverting input of the comparator 224. The output of the comparator 224 is an error signal representing the difference between the value of $V_{det}$ and $V_{dac}$ and forms the power control signal ($V_L$) that is supplied to the power amplifier 140 over connection 116 and that is used to control the output of the power amplifier 140.

The value of the voltage signal, ($V_{det}$), on connection 222 is used to vary, adjust, or otherwise modify or influence the impedance presented by the adjustable load 210 to the collector terminal of the power amplifier output stage 230 on connection 118. When the power amplifier output stage 230 transmits at relatively high power level, the impedance of the adjustable load 210 is reduced, thus lowering the impedance at the collector 118, lowering the load line and improving the linearity of the amplifier output stage 230. Lowering the impedance at the collector 118 allows a broader (higher) range of voltage swing at the collector 118. This also improves adjacent channel power rejection (ACPR) performance of the power amplifier output stage 230.

Figure 3:
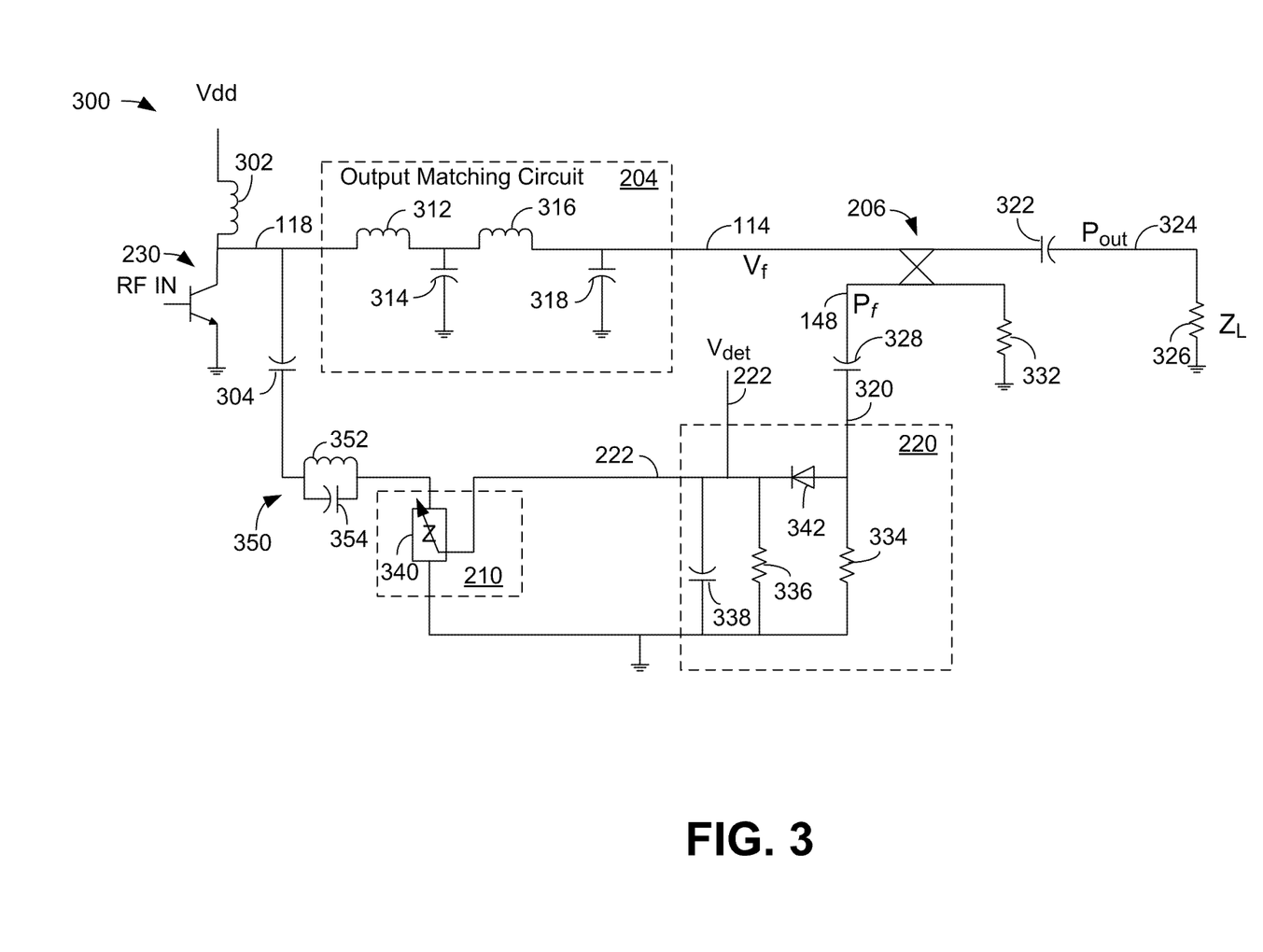
FIG. 3 is a schematic diagram illustrating the system and method for power detection in a power amplifier using an adjustable load of FIG. 2.

FIG. 3 is a schematic diagram illustrating an embodiment of the system and method for power detection in a power amplifier using an adjustable load of FIG. 2. In this embodiment, the power amplifier output stage 230 is connected through an inductance 302 to system voltage $V_{dd}$. The collector terminal of the power amplifier output stage 230 is connected via connection 118 to the output matching circuit 204. The output matching circuit 204 includes inductances 312 and 316 and capacitances 314 and 318.

It should be understood that inductances, capacitances, and resistances are illustrated herein with the understanding that the functions of these elements may be accomplished by elements, or combinations of elements other than conventional inductors, capacitors, and resistors.

The output of the matching circuit 204 on connection 114 is the output of the power amplifier 140 described above. An RF coupler 206 diverts a portion of the output of the power amplifier 140 on connection 114 via connection 148. The RF energy on connection 148 is passed through a capacitance 328 and is then supplied to the first power detector 220. In this embodiment, the first power detector 220 is also referred to as a forward power detector. The first power detector 220 includes a diode 342, resistances 334 and 336, and a capacitance 338. The RF energy present on connection 320 is rectified by the diode 342 to provide a forward detected power signal on connection 222.

The output of the power amplifier output stage 230 on connection 118 is also provided via a capacitance 304 to a harmonic trap 350. The harmonic trap 350 includes an inductance 352 and a capacitance 354. The output of the harmonic trap 350 is provided to the adjustable load 210.

For reliable and accurate power detection it is desirable to provide the harmonic trap 350 to allow the adjustable load 210 to receive a harmonic free signal. The harmonic trap 350 prevents harmonics on the signal on connection 118 from entering the adjustable load 210. The harmonic trap 350 substantially removes all but the fundamental signal components on connection 118. The amount of harmonic filtering can be traded off against the desired accuracy of the linear power detection.

The output of the harmonic trap 350 is provided over connection to 366 as an input to the adjustable load 210. In an embodiment, the adjustable load 210 provides a variable impedance that is responsive to and dependent on the value of the $V_{det}$ signal provided by the first detector 220 on connection 222. In an embodiment, the adjustable load 210 comprises a variable impedance. However, other architectures for providing an adjustable load are possible. For example, the variable impedance 340 can be implemented as a variable capacitance, such as a varactor, or a variable resistance, such as a pin diode. The larger the capacitance at the collector the lower the impedance. The adjustability may involve the resistive component, Rj, and a capacitive component, Rj+Im and can be used to tune the ratio of power added efficiency (PAE)/output power (Pout)). The variable impedance 340 can be used as a low ohmic shunt element (for example, if the output matching circuit 204 has high ohmic impedance), or as a part of the output match transformation performed by the output matching circuit 204, which comprises both inductive and capacitive elements.

The output matching circuit 204 is tuned to provide a relatively high impedance for low power operation. The high impedance provides a good power added efficiency (PAE) at lower power amplifier output levels. Unfortunately, the relatively high impedance provided by the output matching circuit 204 reduces the available voltage range at the collector 118 at higher power levels. Therefore, when the output power increases, the first detector 220 provides the indication of higher output power, in the form of the Vdet signal, to the adjustable load 210. In response, the adjustable load 210 lowers the impedance on the collector 118, thus improving the voltage headroom on the collector 118 and improving the ACPR performance of the power amplifier output stage 230.

Figure 4:
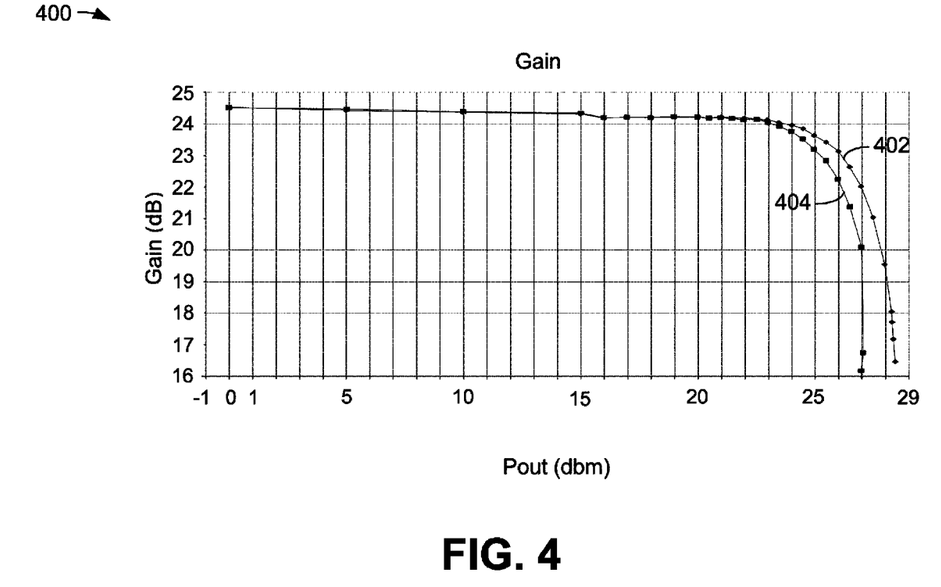
FIG. 4 is a graphical illustration showing test results for gain compression using the adjustable load of FIGS. 2 and 3.

FIG. 4 is a graphical illustration 400 showing open loop test results for gain compression using the adjustable load of FIGS. 2 and 3. As shown in FIG. 4, trace 402 shows the improvement in gain compression using the adjustable load 210 compared to trace 404, which shows gain compression without the adjustable load 210.

Figure 5:
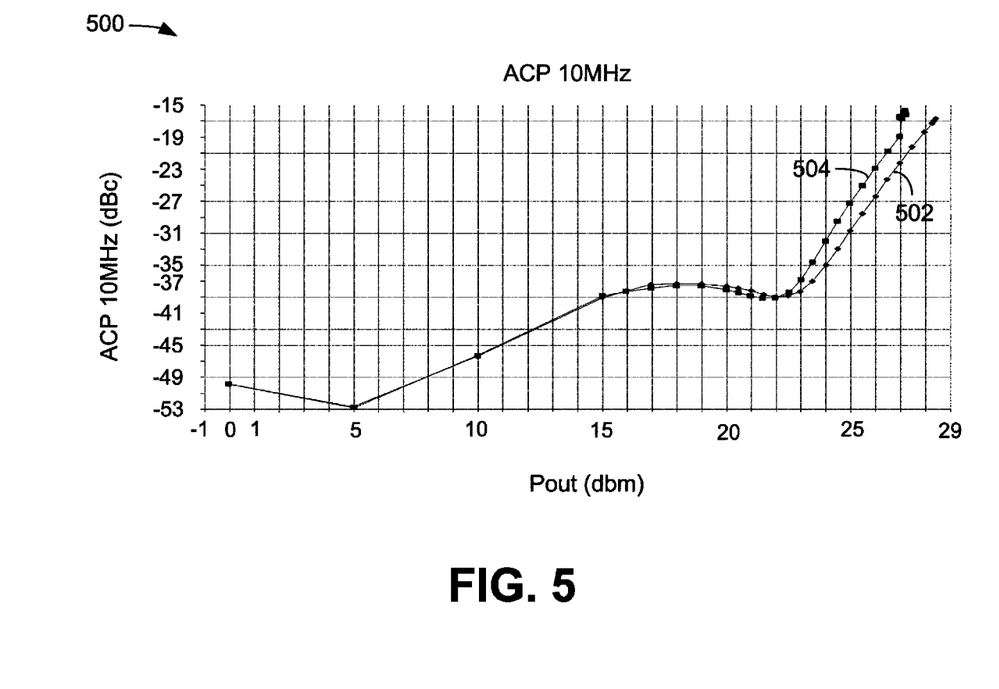
FIG. 5 is a graphical illustration showing test results illustrating adjacent channel power ratio (ACPR) performance for a power amplifier implementing the adjustable load of FIGS. 2 and 3.

FIG. 5 is a graphical illustration 500 showing open loop test results illustrating adjacent channel power ratio (ACPR) performance for a power amplifier implementing the adjustable load of FIGS. 2 and 3. As shown in FIG. 5, trace 502 shows an approximate 3-4 dB improvement in ACPR performance for a 10 MHz 16 (quadrature amplitude modulation) QAM signal for higher power levels when the adjustable load 210 is implemented, as compared to trace 504.

Figure 6:
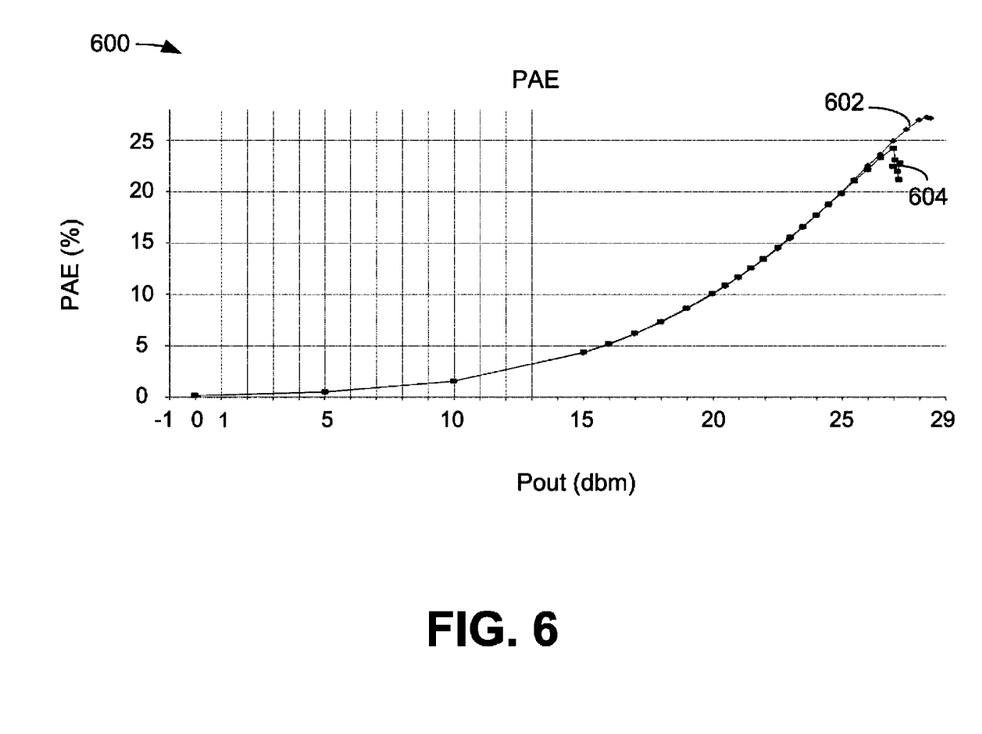
FIG. 6 is a graphical illustration showing test results illustrating the power added efficiency of a power amplifier implementing the adjustable load of FIGS. 2 and 3.

FIG. 6 is a graphical illustration 600 showing open loop test results illustrating the power added efficiency (PAE) of a power amplifier implementing the adjustable load of FIGS. 2 and 3. As shown in FIG. 6, trace 602 shows that the performance for a front end module at 2.6 GHz implementing the adjustable load 210 is the same or higher than without the adjustable load 210, which is shown by trace 604.

Figure 7:
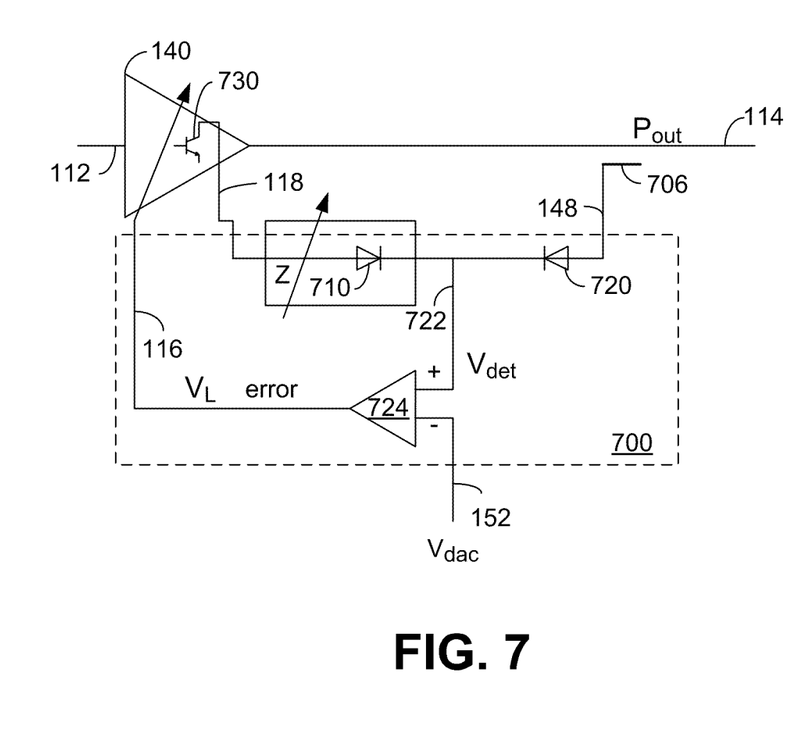
FIG. 7 is a simplified schematic diagram illustrating an alternative embodiment of a power control system implemented using an embodiment of the system and method for power detection in a power amplifier using an adjustable load.

FIG. 7 is a simplified schematic diagram illustrating an alternative embodiment of a power control system 200 implemented using an embodiment of the system and method for power detection in a power amplifier using an adjustable output load. The power amplifier control element 700 is similar to the power amplifier control element 200 of FIG. 2, and elements in FIG. 7 that are similar to corresponding elements in FIG. 7 will be numbered according to the convention 7XX, where "XX" refers to an element in FIG. 7 that is similar to a corresponding element in FIG. 2. The power amplifier control element 700 receives a portion of the output of the power amplifier 140 on connection 114 via a radio frequency (RF) coupler 706. The RF feedback signal is provided over connection 148 to a first detector 720. For illustrative purposes only, the first detector 720 is illustrated as a diode. In an embodiment, the first detector 720 may comprise a diode detector, or any other type of average or peak power detector. The first detector 720 is also referred to as a forward power detector because it receives the forward power output signal from the power amplifier 140.

Although illustrated schematically as a single power amplifier, the power amplifier 140 may include a number of power amplifier output stages, an exemplary one of which is illustrated schematically as a bi-polar junction transistor using reference numeral 730. However, other transistor structures, such as a field effect transistor, may be implemented. The power amplifier output stage 730 is shown as a bipolar transistor to illustrate that a collector parameter is provided to a second detector 710 over connection 118. The collector parameter can be, for example, a collector voltage signal, a collector current signal, or any other collector parameter that is indicative of whether the power amplifier stage 730 is operating at or near saturation. If the power amplifier is implemented as a field effect transistor, a drain parameter may be used. For example, in a field effect transistor the drain source voltage, Vds, can be measured.

The second detector 710, which is also referred to as a collector parameter detector, can be similar to the first detector 720. In an embodiment, the second detector 710 functions not only as a power detector, but also functions similar to the adjustable load 210 described above. In an embodiment, the second detector 710 can comprise circuitry to generate an adjustable or variable impedance at the collector terminal of the amplifier output stage 730 on connection 118, where the impedance provided by the second detector 710 is responsive to the RF input from the collector 118.

The combined output of the second detector 710 and the first detector 720 is a detector signal ($V_{det}$) that is supplied over connection 722 to the non-inverting input of a comparator 724. A reference signal ($V_{dac}$) from the DAC 160 (FIG. 1) is supplied via connection 152 to the inverting input of the comparator 724. The output of the comparator 724 is an error signal representing the difference between the value of $V_{det}$ and $V_{dac}$ and forms the power control signal ($V_L$) that is supplied to the power amplifier 140 over connection 116 and that is used to control the output of the power amplifier 140.

One of the primary causes of power amplifier linearity degradation is saturation of the power amplifier 140 caused by a high collector voltage. Therefore, in an embodiment, the collector voltage of the power amplifier output stage 730 can be used as an indicator of the saturation effect. The combination of the first detector 720 and the second detector 710 monitors both the output power of the power amplifier and the collector voltage of the power amplifier output stage 730.

In an embodiment, the value of the RF input signal on the collector 118 is used to vary, adjust, modify or otherwise influence the impedance presented by the second detector 710 to the collector terminal of the amplifier output stage 730 on connection 118. At relatively high power levels, the voltage at the collector 118 increases, thus increasing the current and lowering the impedance provided by the second detector 710. The variable impedance provided by the diode action of the second detector 710 is given by the junction resistance, Rj, of the second detector 710 according to the equation Rj=nkT/q (Isat+Io) where Io=Isat*[exp(q(V−IRs)/nKT)−1] and Io is the current through the diode detector 710 depending on the voltage at the collector 118.

According to the equation Io=Isat*[exp(q(V−IRs)/nKT)−1], the impedance of the second detector 710 at the collector 118 is lowered as the voltage at the collector 118 rises. The term Io also equates to the output current of the power amplifier output stage 730, Isat is the saturation current of the power amplifier output stage 730, q is the electronic charge (1.60206×10$^{-19}$ C), V is the RF voltage at the collector 118, Rs is the series resistance, n is the ideality factor (typically 1.0), K is Boltzmann's constant, and T is the temperature (degrees K).

The junction resistance, Rj, of the second detector 710 is given by Rj=nkT/q(Isat+Io). The term n is the ideality factor (typically 1.0), K is Boltzmann's constant, T is the temperature (degrees K), and q is the electronic charge (1.60206×

10⁻¹⁹ C). Alternatively, the ratio between the current and the voltage across the second detector 710 can be adjusted by an attenuator comprising resistors and capacitors.

Accordingly, the output impedance becomes lower and provides the power amplifier output stage 730 more voltage headroom; and the contribution to $V_{det}$ provided by the second detector 710 increases while $P_{out}$ decreases in order to keep the total $V_{det}$ on connection 222 constant.

Figure 8:
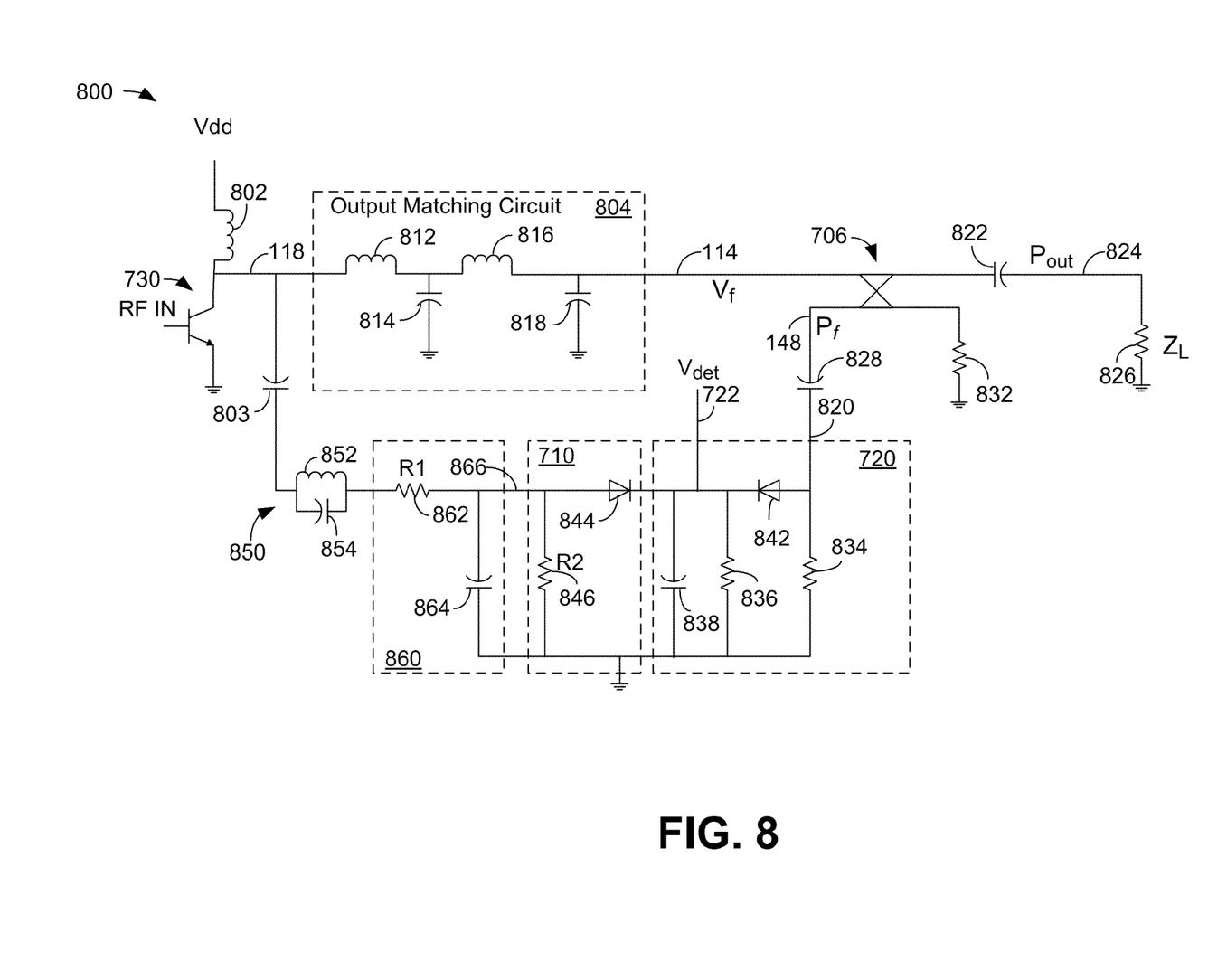
FIG. 8 is a schematic diagram illustrating the system and method for power detection in a power amplifier using an adjustable load of FIG. 7.

FIG. 8 is a schematic diagram illustrating an embodiment of the system and method for power detection in a power amplifier using an adjustable load of FIG. 7. In this embodiment, the power amplifier output stage 730 is connected through an inductance 802 to system voltage, $V_{dd}$. The collector terminal of the power amplifier output stage 730 is connected via connection 118 to an output matching circuit 804. The output matching circuit 804 includes inductances 812 and 816 and capacitances 814 and 818.

It should be understood that inductances, capacitances, and resistances are illustrated in FIG. 8 with the understanding that the functions of these elements may be accomplished by elements, or combinations of elements other than conventional inductors, capacitors, and resistors.

The output of the matching circuit 804 on connection 114 is the output of the power amplifier 140 described above. An RF coupler 706 diverts a portion of the output of the power amplifier 140 on connection 114 via connection 148. The RF energy on connection 148 is passed through a capacitance 828 and is then supplied to the first power detector 720. In this embodiment, the first power detector 720 is also referred to as a forward power detector. The first power detector 720 includes a diode 842, resistances 834 and 836, and a capacitance 838. The RF energy present on connection 820 is rectified by the diode 842 to provide a forward detected power signal on connection 722.

The output of the power amplifier output stage 730 on connection 118 is also provided via a capacitance 803 to a harmonic trap 850. The harmonic trap 850 includes an inductance 852 and a capacitance 854. The output of the harmonic trap 850 is provided to an attenuator/filter 860. The attenuator/filter 860 includes a resistance 862 and a capacitance 864.

For reliable and accurate power detection it is desirable to provide the harmonic trap 850 and the attenuator/filter 860 to allow the second detector 710 to receive a harmonic free detected signal. The harmonic trap 850 and the attenuator/filter 860 prevent harmonics on the signal on connection 118 from entering the second detector 710. The harmonic trap 850 and the attenuator/filter 860 substantially remove all but the fundamental signal components on connection 118. The amount of harmonic filtering and attenuation can be traded off against the desired accuracy of the linear power detection.

The output of the attenuator/filter 860 is provided over connection to 866 as an input to the second detector 710. The second detector 710 is also referred to as a collector power detector 710. The second detector 710 includes a diode 844 and a resistance 846. The diode 844 rectifies the signal on connection 866 and provides a detector output on connection 722. The signal on connection 722 is a combined detector signal that forms the input the $V_{det}$ to the comparator 724 (FIG. 7). In an embodiment, the second detector 710 provides a variable impedance that is responsive to and dependent on the value of the RF signal on connection 118.

The output matching circuit 804 is tuned to provide relatively high impedance for low power operation. The high impedance provides a good power added efficiency (PAE) at lower power amplifier output levels. Unfortunately, the relatively high impedance provided by the output matching circuit 804 reduces the available voltage range at the collector 118 at higher power levels. Therefore, when the output power increases, the second detector 710 senses the voltage swing at the collector 118. The voltage swing at the collector 118 is a direct indication of the loading presented at the collector 118.

The output detection voltage ($V_{det}$) is proportional to:

$$V_{det} \sim kV_{ce} + V_f \qquad \text{(Eq. 1)}$$

where $V_{ce}$ is the collector-emitter voltage on the collector of power amplifier output stage 730, $V_f \sim \sqrt{2P_fZ_L}$ is the forward detected voltage, which is proportional to the forward power ($P_f$) as a function of the load impedance ($Z_L$) and k is a coefficient tunable by varying the resistance 862 (R1).

The value of the resistance 862 (R1) and the value of the resistance 846 (R2) determines the ratio of the output of the first detector 720 and the second detector 710 according to the value of R2/(R1+R2). This defines the value of the signal that will be provided over connection 722. The ratio of the contribution of the first detector 720 and the second detector 710 to the detector signal on connection 722 is determined based on the impedance at the output of the power amplifier load 826.

Figure 9:
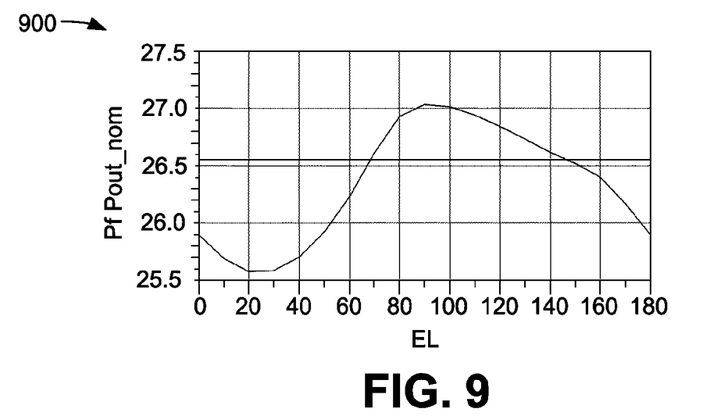
FIG. 9 is a graph illustrating power accuracy for a 1.7:1 voltage standing wave ratio (VSWR).

By choosing different values of R1 the linearity/output power control ratio can be determined. For a power output $P_{out}$=26.5 dBm and a backoff of 3.5 dB ($P_{1\,dB}$=30 dBm) in a 50 Ohm load for the value of R1=75 Ohm, a 2.5 dB backoff is maintained for a 3:1 voltage standing wave ratio (VSWR). Further, a power accuracy of +0.4/−1 dB is maintained for a 1.7:1 VSWR, as shown in FIG. 9. When the collector voltage signal on connection 866 becomes dominant, indicating power amplifier saturation, the signal on connection 822 primarily includes the collector voltage of the power amplifier power output stage 730. In this scenario, the combined detector signal ($V_{det}$) provided on connection 722 includes a substantial portion of the collector voltage. In this manner, the level of the collector voltage is used to reduce the output of the power amplifier through the operation of the comparator 724 (FIG. 7) as described above. The value of $V_{det}$ is dependent on the phase of the output signal on connection 114. Therefore, the $V_{det}$ signal on connection 722 also varies with the phase of the output signal. The signal provided by the coupler 706 is phase independent, assuming the coupler provides good isolation. The collector-emitter voltage ($V_{ce}$) across the power output stage 730 is dependent on the phase of the output signal. When the load impedance, $Z_L$ enters a low impedance area, the collector-emitter voltage, $V_{ce}$, decreases and the collector-emitter current, $I_{ce}$, increases, leading to excessive current consumption. When the load impedance, $Z_L$ enters a high impedance area, the collector-emitter voltage, $V_{ce}$, increases and the collector-emitter current, $I_{ce}$, decreases, leading to power amplifier saturation and linearity degradation.

Figure 10:
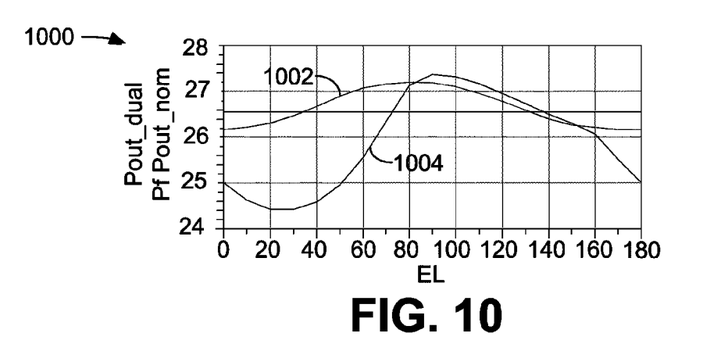
FIG. 10 illustrates power amplifier output power deviation at 3:1 VSWR.
Figure 11:
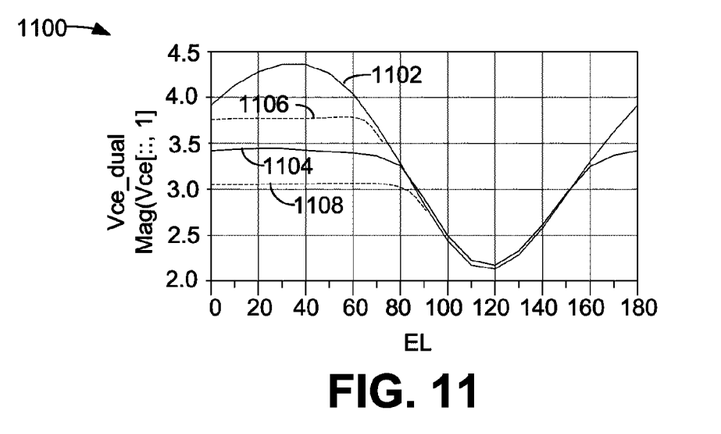
FIG. 11 illustrates collector voltage at 3:1 VSWR for forward power detection and dual power detection.

To increase power accuracy, the value of the resistance, 862 (R1), is increased. Increasing the value of the resistance 862 (R1) to a relatively high value compared to resistance 846 (R2) increases the power accuracy of the detectors. The detector voltage, $V_{det}$, is proportional to the collector-emitter voltage ($V_{ce}$) across the power output stage 730 and the forward power detected signal ($V_f$) according to $V_{det} \sim V_{ce}*R2(R1+R2)+V_f$. Therefore, if the value of R1 is very high relative to the value of R2, then $V_{det} \sim V_f$. Thus, gain compression for this scheme for VSWR 3:1 results in power amplifier backoff being reduced only to 0.7 dB compared with 2.5 dB in the case of a relatively low value of R1. Therefore, using only the forward power detector 220 sacrifices power amplifier linearity. A comparison between output power/collector voltage trade-off versus phase for 3:1 VSWR are shown in FIG. 10 and FIG. 11, respectively. The impedance change presented by the second detector 710 will be significant for the high impedance phases of the output match circuit 804, as given by Rj*Zout/(Rj+Zout) where Zout is an output match impedance and Rj is an impedance of the second detector 710.

FIG. 10 illustrates power amplifier output power in the situation in which the trace 1002 illustrates output power deviation at 3:1 VSWR when just the forward power detector 720 is implemented. The trace 1004 illustrates output power deviation at 3:1 VSWR when the first power detector 720 and the second power detector 710 are implemented.

FIG. 11 illustrates collector voltage in the situation in which the trace 1102 illustrates collector voltage at 3:1 VSWR when just the forward power detector 720 is implemented. The trace 1104 illustrates collector voltage at 3:1 VSWR when the first power detector 720 and the second power detector 710 are implemented. The trace 1104 illustrates that the collector voltage of the power amplifier output stage 730 is fixed during the portion of the output phase where high output impedance exists. The dotted line 1106 represents an example upper limit of the collector voltage and the dotted line 1108 represents an example lower limit of the collector voltage.

As shown in FIGS. 10 and 11, implementing the dual detector solution allows a tradeoff between linearity and output power accuracy by reducing power for the most nonlinear phases where high impedance is causing the high voltage.

Figure 12:
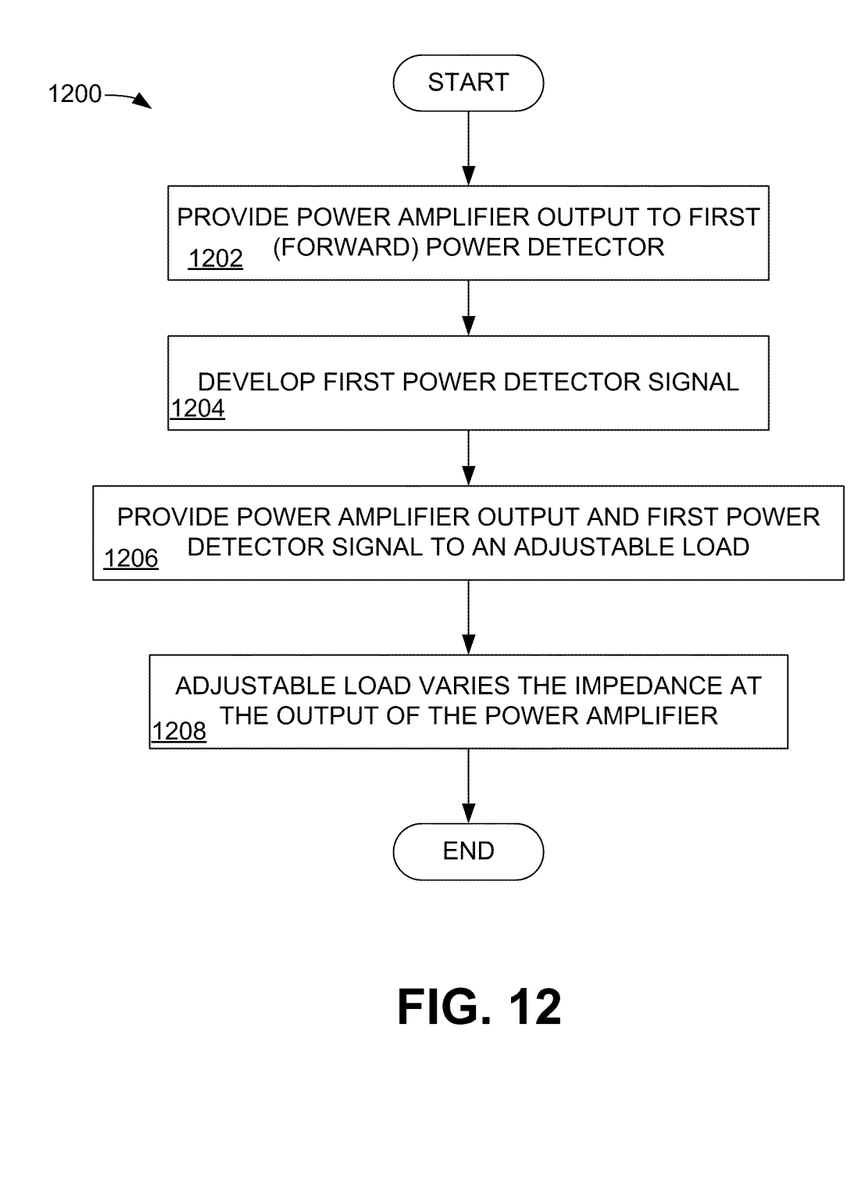
FIG. 12 is a flow chart describing the operation of an embodiment of the system and method for power detection in a power amplifier using an adjustable load.

FIG. 12 is a flow chart 1200 describing the operation of an embodiment of the system and method for power detection in a power amplifier using an adjustable load. The blocks in the flowchart can be performed in or out of the order shown by the elements described above.

In block 1202, the output of the power amplifier 140 is provided to a first power detector 220. In block 1204, the first power detector 220 forms a first power detector signal. In block 1206, the first power detector signal and the output of the power amplifier are provided to an adjustable load. In block 1208, the adjustable load varies the impedance at the collector terminal of the power amplifier in response to the first power detector signal.

Figure 13:
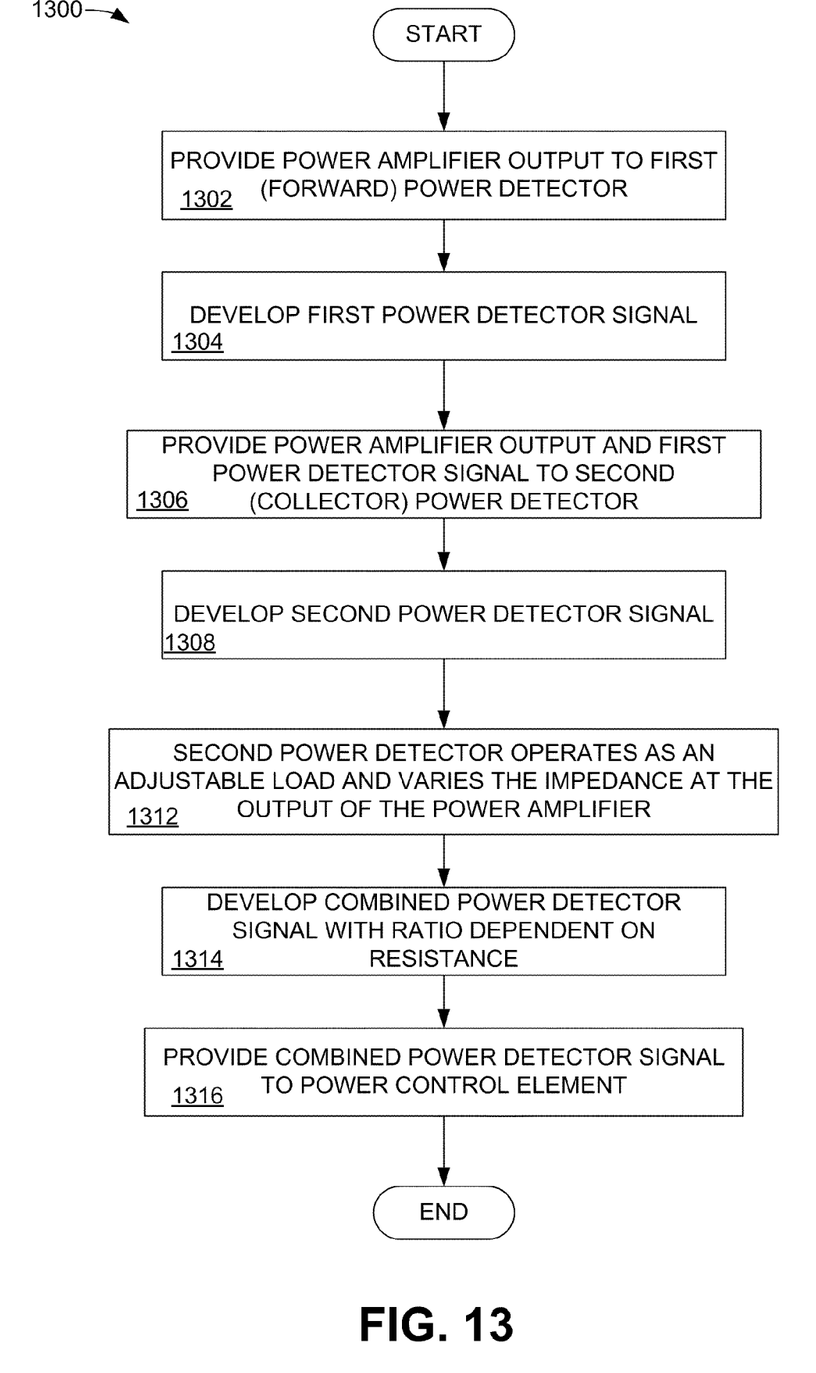
FIG. 13 is a flow chart describing the operation of an alternative embodiment of the system and method for power detection in a power amplifier using an adjustable load.

FIG. 13 is a flow chart 1300 describing the operation of an alternative embodiment of the system and method for power detection in a power amplifier using an adjustable load. The blocks in the flowchart can be performed in or out of the order shown by the elements described above.

In block 1302, the output of the power amplifier 140 is provided to a first power detector 720. In block 1304, the first power detector 720 forms a first power detector signal. In block 1306, a collector parameter of the power amplifier 140 and the first power detector signal are provided to a second power detector 710. In block 1308, the second power detector forms a second power detector signal.

In block 1312, the second power detector operates as an adjustable load and varies the impedance at the collector terminal of the power amplifier in response to the RF signal at the collector of the power amplifier output stage.

In block 1314, a combined power detector signal is developed. The ratio of the first power detector signal to the second power detector signal that makes up the combined power detector signal is dependent on the value of the resistance 862 (R1) and 846 (R2) in FIG. 8. In block 1316, the combined power detector signal is provided to the power control element 200 (FIG. 2) and 700 (FIG. 7).

While various embodiments of the invention have been described, it will be apparent to those of ordinary skill in the art that many more embodiments and implementations are possible that are within the scope of the invention. For example, the invention is not limited to a specific type of radio transmitter or power amplifier.

What is claimed is:

1. A power amplifier system comprising:
a first power detector configured to detect a forward power output of a power amplifier, the first power detector further configured to provide a first power detector output;
an adjustable load coupled to the output of the power amplifier and configured to receive the first power detector output, the adjustable load further configured to provide an adjustable impedance at the output of the power amplifier in response to one of the output of the power amplifier and the first power detector output; and
a second power detector configured to receive a collector parameter signal from the power amplifier and detect a collector parameter therefrom, the second power detector further configured to provide a second power detector output, the second power detector including the adjustable load.

2. The system of claim 1 wherein the first power detector output is a voltage signal and the adjustable load is a voltage controlled impedance.

3. The system of claim 1 wherein the first power detector and the adjustable load control the output linearity of the power amplifier.

4. The system of claim 1 wherein the collector parameter signal is a collector voltage signal.

5. The system of claim 1 wherein the collector parameter signal is a collector current signal.

6. The system of claim 1 wherein the first power detector output and the second power detector output are combined to form a combined power detector output.

7. The system of claim 6 wherein a ratio of the first power detector output and the second power detector output is based on a resistance value, the first and second power detectors further configured to control the output linearity of the power amplifier and the collector voltage of the power amplifier.

8. The system of claim 6 wherein the first and second power detectors control the output linearity of the power amplifier and the collector voltage of the power amplifier.

9. A portable transceiver comprising:
a transmitter operatively coupled to a power amplifier and to a receiver;
a first power detector configured to detect a forward power output of the power amplifier, the first power detector further configured to provide a first power detector output;
an adjustable load coupled to the output of the power amplifier and configured to receive the first power detector output, the adjustable load further configured to provide an adjustable impedance at the output of the power amplifier in response to one of the output of the power amplifier and the first power detector output; and
a second power detector configured to receive a collector parameter signal from the power amplifier and detect a collector parameter therefrom, the second power detector further configured to provide a second power detector output, the second power detector including the adjustable load.

10. The portable transceiver of claim 9 wherein the first power detector output is a voltage signal and the adjustable load is a voltage controlled impedance.

11. The portable transceiver of claim 9 wherein the first power detector and the adjustable load control the output linearity of the power amplifier.

12. The portable transceiver of claim 9 wherein the collector parameter signal is a collector voltage signal.

13. The portable transceiver of claim 9 wherein the first power detector output and the second power detector output are combined to form a combined power detector output.

14. The portable transceiver of claim 13 wherein a ratio of the first power detector output and the second power detector output is based on a resistance value.

15. The portable transceiver of claim 13 wherein the first and second power detectors control the output linearity of the power amplifier and the collector voltage of the power amplifier.

* * * * *